US012724076B2

(12) United States Patent
Hu et al.

(10) Patent No.: US 12,724,076 B2
(45) Date of Patent: Sep. 1, 2026

(54) METHOD FOR ESTIMATION OF STATE OF CHARGE AND STATE OF HEALTH IN A LITHIUM-ION BATTERY PACK, AND SYSTEM THEREOF

(71) Applicant: Hong Kong Metropolitan University, Kowloon (CN)

(72) Inventors: Panpan Hu, Kowloon (CN); Chi Chung Lee, Kowloon (CN); Chun Yin Li, Kowloon (CN)

(73) Assignee: HONG KONG METROPOLITAN UNIVERSITY, Kowloon (CN)

(*) Notice: Subject to any disclaimer, the term of this patent is extended or adjusted under 35 U.S.C. 154(b) by 258 days.

(21) Appl. No.: 18/418,564

(22) Filed: Jan. 22, 2024

(65) Prior Publication Data

US 2025/0237703 A1 Jul. 24, 2025

(51) Int. Cl.
*G01R 31/367* (2019.01)
*G01R 31/387* (2019.01)
(Continued)

(52) U.S. Cl.
CPC ......... *G01R 31/367* (2019.01); *G01R 31/387* (2019.01); *G01R 31/392* (2019.01); *G01R 31/396* (2019.01)

(58) Field of Classification Search
CPC .. G01R 31/367; G01R 31/387; G01R 31/392; G01R 31/396
(Continued)

(56) References Cited

U.S. PATENT DOCUMENTS 11,065,978 B2 * 7/2021 Aykol ....................... B60L 3/12
11,527,786 B1 * 12/2022 Budan ...................... G07C 5/04
(Continued)

FOREIGN PATENT DOCUMENTS

CN 113064093 A 7/2021
CN 115865716 A 3/2023

OTHER PUBLICATIONS

Australian Government, IP Australia, Jan. 21, 2025, Examination Report No. 1 for standard patent application No. 2024200894, 12 pages total.
(Continued)

*Primary Examiner* — Giovanni Astacio-Oquendo
*Assistant Examiner* — Trung Q Nguyen
(74) *Attorney, Agent, or Firm* — Francis J. Maguire; WARE FRESSOLA MAGUIRE & BARBER LLP

(57) ABSTRACT

A machine learning method of estimating State of Charge (SOC) and State of Health (SOH) of a battery pack, the method including collecting time-series data of a battery pack; processing the collected data utilizing a reconstruction algorithm to reconstruct a first phase state space reconstruction; training a first neural network model using the first phase state space reconstruction for predicting the SOH; feeding the time-series data to the first neural network to predict an estimated SOH value; processing the time-series data utilizing the reconstruction algorithm to reconstruct a second phase state space reconstruction; training a second neural network model using the second phase state space reconstruction, taking into account the estimated SOH value, for predicting the SOC, and feeding the time-series data and the estimated SOH value to the second neural network to obtain an estimated SOC value. A system configured to perform the above method is also disclosed.

22 Claims, 8 Drawing Sheets

(51) Int. Cl.
*G01R 31/392* (2019.01)
*G01R 31/396* (2019.01)

(58) Field of Classification Search
USPC ...................... 324/500, 600, 76.11, 415–433
See application file for complete search history.

(56) References Cited

U.S. PATENT DOCUMENTS

| | | | | |
|---|---|---|---|---|
| 2009/0104510 | A1* | 4/2009 | Fulop | G01R 31/54 429/50 |
| 2020/0036002 | A1* | 1/2020 | Chakraborty | H01M 10/48 |
| 2020/0081070 | A1* | 3/2020 | Chemali | H01M 10/425 |
| 2020/0271725 | A1* | 8/2020 | Herring | B60L 58/12 |
| 2021/0173012 | A1* | 6/2021 | Subbotin | G01R 31/3842 |
| 2022/0314837 | A1* | 10/2022 | Gupta | B60L 58/26 |
| 2024/0110984 | A1* | 4/2024 | Park | G01R 31/387 |

OTHER PUBLICATIONS

Panpan Hu et al. "Joint State of Charge (SOC) and State of Health (SOH) Estimation for Lithium-Ion Batteries Packs of Electric Vehicles Based on NSSR-LSTM Neural Network," Energies 2023, 16, 5313, published Jul. 11, 2023, pp. 1-19,19 pages total.
Hicham Chaoui et al., "State of Charge and State of Health Estimation for Lithium Batteries Using Recurrent Neural Networks," IEEE Transactions on Vehicular Technology, vol. 66, No. 10, Oct. 2017, pp. 8773-8783, 11 pages total.
X. Wang et al., "Joint prediction of Li-ion battery state of charge and state of health based on the DRSN-CW-LSTM model," IEEE Access, vol. 11, 2023, published Jul. 10, 2023, pp. 70263-70273, 11 pages total.
Jong-Hyun Lee et al, "Estimation of Online State of Charge and State of Health Based on Neural Network Model Banks Using Lithium Batteries," Sensors, 2022, 22, 5536, published Jul. 25, 2022, pp. 1-20, 20 pages total.
Qizheng Qian et al, "Remaining useful life prediction of lithium-ion batteries based on phase space reconstruction and optimized LSTM network," Proceedings of the 40th Chinese Control Conference, Jul. 26-28, 2021, Shanghai, China, pp. 4344-4349, 6 pages total.
Jun Zhang et al, "Time series prediction using RNN in multi-dimension embedding phase space," pp. 1868-1873 [Date Added to IEEE Xplpore: Aug. 6, 2002], SMC '98 conference proceedings, 1998 IEEE international conference on systems, man, and cybernetics, vol. 2. IEEE, 1998, 6 pages total.
Che, Y.; Liu, Y.; Cheng, Z.; Zhang, J. SOC and SOH Identification Method of Li-Ion Battery Based on SWPSO-DRNN. IEEE J. Emerg. Sel. Top. Power Electron. 2021, 9, 4050-4061, 12 pages.
Ma, Y.; Duan, P.; Sun, Y.; Chen, H. Equalization of Lithium-Ion Battery Pack Based on Fuzzy Logic Control in Electric Vehicle. IEEE Trans. Ind. Electron. 2018, 65, 6762-6771, 10 pages.
Huang, D.; Chen, Z.; Zheng, C.; Li, H. A model-based state-of-charge estimation method for series-connected lithium-ion battery pack considering fast-varying cell temperature. Energy 2019, 185, 847-861, 15 pages.
Ng, K.S.; Moo, C.-S.; Chen, Y.-P.; Hsieh, Y.-C. Enhanced coulomb counting method for estimating state-of-charge and state-of health of lithium-ion batteries. Appl. Energy 2009, 86, 1506-1511, 6 pages.
Bonfitto, A. A Method for the Combined Estimation of Battery State of Charge and State of Health Based on Artificial Neural Networks. Energies 2020, 13, 2548, 13 pages.
Kim, T.; Wang, Y.; Fang, H.; Sahinoglu, Z.; Wada, T.; Hara, S.; Qiao, W. Model-based condition monitoring for lithium-ion batteries. J. Power Sources 2015, 295, 16-27, 12 pages.
Zeng, M.; Zhang, P.; Yang, Y.; Xie, C.; Shi, Y. SOC and SOH Joint Estimation of the Power Batteries Based on Fuzzy Unscented Kalman Filtering Algorithm. Energies 2019, 12, 3122, 15 pages.
Almaita, E.; Alshkoor, S.; Abdelsalam, E.; Almomani, F. State of charge estimation for a group of lithium-ion batteries using long short-term memory neural network. J. Energy Storage 2022, 52, 104761, pp. 1-14, 14 pages.
Zhong, L.; Zhang, C.; He, Y.; Chen, Z. A method for the estimation of the battery pack state of charge based on in-pack cells uniformity analysis. Appl. Energy 2014, 113, 558-564, 7 pages.
Che, Y.; Foley, A.; El-Gindy, M.; Lin, X.; Hu, X.; Pecht, M. Joint Estimation of Inconsistency and State of Health for Series Battery Packs. Automot. Innov. 2021, 4, 103-116, 14 pages.
Shu, X.; Li, G.; Zhang, Y.; Shen, S.; Chen, Z.; Liu, Y. Stage of Charge Estimation of Lithium-Ion Battery Packs Based on Improved Cubature Kalman Filter with Long Short-Term Memory Model. IEEE Trans. Transp. Electrif. 2021, 7, 1271-1284, 14 pages.
Zhao, L.; Lin, M.; Chen, Y. Least-squares based coulomb counting method and its application for state-of-charge (SOC) estimation in electric vehicles. Int. J. Energy Res. 2016, 40, 1389-1399, 11 pages.
Gismero, A.; Schaltz, E.; Stroe, D.-I. Recursive State of Charge and State of Health Estimation Method for Lithium-Ion Batteries Based on Coulomb Counting and Open Circuit Voltage. Energies 2020, 13, 1811, 11 pages.
Xu, Y.; Li, C.; Wang, X.; Zhang, H.; Yang, F.; Ma, L.; Wang, Y. Joint Estimation Method with Multi-Innovation Unscented Kalman Filter Based on Fractional-Order Model for State of Charge and State of Health Estimation. Sustainability 2022, 14, 15538, 25 pages.
Xing, Y.; He, W.; Pecht, M.; Tsui, K.L. State of charge estimation of lithium-ion batteries using the open-circuit voltage at various ambient temperatures. Appl. Energy 2014, 113, 106-115, 10 pages.
Yang, F.; Song, X.; Xu, F.; Tsui, K.-L. State-of-Charge Estimation of Lithium-Ion Batteries via Long Short-Term Memory Network. IEEE Access 2019, 7, 53792-53799, 8 pages.
Yang, F.; Xing, Y.; Wang, D.; Tsui, K.-L. A comparative study of three model-based algorithms for estimating state-of-charge of lithium-ion batteries under a new combined dynamic loading profile. Appl. Energy 2016, 164, 387-399., 13 pages.
Zhang, X.; Hou, J.; Wang, Z.; Jiang, Y. Joint SOH-SOC Estimation Model for Lithium-Ion Batteries Based on GWO-BP Neural Network. Energies 2022, 16, 132, 17 pages.
Qian, C.; Xu, B.; Xia, Q.; Ren, Y.; Yang, D.; Wang, Z. A Dual-Input Neural Network for Online State-of-Charge Estimation of the Lithium-Ion Battery throughout Its Lifetime. Materials 2022, 15, 5933, 13 pages.
Lee, J.-H.; Lee, I.-S. Estimation of Online State of Charge and State of Health Based on Neural Network Model Banks Using Lithium Batteries. Sensors 2022, 22, 5536, 20 pages.
Fasahat, M.; Manthouri, M. State of charge estimation of lithium-ion batteries using hybrid autoencoder and Long Short Term Memory neural networks. J. Power Sources 2020, 469, 228375, 8 pages.
Lee, J.-H.; Kim, H.-S.; Lee, I.-S. State of Charge Estimation and State of Health Diagnostic Method Using Multilayer Neural Networks. In Proceedings of the 2021 International Conference on Electronics, Information, and Communication (ICEIC), Jeju, Republic of Korea, Jan. 31-Feb. 3, 2021, 4 pages.
Yang, J.; Xia, B.; Huang, W.; Fu, Y.; Mi, C. Online state-of-health estimation for lithium-ion batteries using constant-voltage charging current analysis. Appl. Energy 2018, 212, 1589-1600, 12 pages.
Li, X.; Wang, Z.; Zhang, L.; Zou, C.; Dorrell, D.D. State-of-health estimation for Li-ion batteries by combing the incremental capacity analysis method with grey relational analysis. J. Power Sources 2019, 410-411, 106-114, 9 pages.
Yang, D.; Zhang, X.; Pan, R.; Wang, Y.; Chen, Z. A novel Gaussian process regression model for state-of-health estimation of lithium-ion battery using charging curve. J. Power Sources 2018, 384, 387-395, 9 pages.
Qu, J.; Liu, F.; Ma, Y.; Fan, J. A Neural-Network-Based Method for RUL Prediction and SOH Monitoring of Lithium-Ion Battery. IEEE Access 2019, 7, 87178-87191, 14 pages.
Huang, S.-C.; Tseng, K.-H.; Liang, J.-W.; Chang, C.-L.; Pecht, M.G. An Online SOC and SOH Estimation Model for Lithium-Ion Batteries. Energies 2017, 10, 512, 18 pages.
Zou, Y.; Hu, X.; Ma, H.; Li, S.E. Combined State of Charge and State of Health estimation over lithium-ion battery cell cycle lifespan for electric vehicles. J. Power Sources 2015, 273, 793-803, 11 pages.
Fang, L.; Li, J.; Peng, B. Online Estimation and Error Analysis of both SOC and SOH of Lithium-ion Battery based on DEKF Method. Energy Procedia 2019, 158, 3008-3013, 6 pages.

(56) References Cited

OTHER PUBLICATIONS

Sun, H.; Sun, J.; Zhao, K.; Wang, L.; Wang, K. Data-Driven ICA-Bi-LSTM-Combined Lithium Battery SOH Estimation. Math. Probl. Eng. 2022, 2022, 9645892, 8 pages.
Lin, H.-T.; Liang, T.-J.; Chen, S.-M. Estimation of Battery State of Health Using Probabilistic Neural Network. IEEE Trans. Ind. Inform. 2013, 9, 679-685, 7 pages.
Yang, N.; Song, Z.; Hofmann, H.; Sun, J. Robust State of Health estimation of lithium-ion batteries using convolutional neural network and random forest. J. Energy Storage 2022, 48, 103857, 9 pages.
Eddahech, A.; Briat, O.; Bertrand, N.; Deletage, J.-Y.; Vinassa, J.-M. Behavior and state-of-health monitoring of Li-ion batteries using impedance spectroscopy and recurrent neural networks. Int. J. Electr. Power Energy Syst. 2012, 42, 487-494, 8 pages.
Hajiloo, R.; Salarieh, H.; Alasty, A. Chaos control in delayed phase space constructed by the Takens embedding theory. Commun. Nonlinear Sci. Numer. Simul. 2018, 54, 453-465, 13 pages.
Deyle, E.R.; Sugihara, G. Generalized Theorems for Nonlinear State Space Reconstruction. PLoS ONE 2011, 6, e18295, 8 pages.
Rui, X.H.; Jin, Y.; Feng, X.Y.; Zhang, L.C.; Chen, C.H. A comparative study on the low-temperature performance of LiFePO4/C and Li3V2(PO4)3/C cathodes for lithium-ion batteries. J. Power Sources 2011, 196, 2109-2114, 6 pages.
Lee, C.C.; Lee, W.C.; Cai, H.; Chi, H.R.; Wu, C.K.; Haase, J.; Gidlund, M.; Li, B. Traffic condition monitoring using weighted kernel density for intelligent transportation. In Proceedings of the 2015 IEEE 13th International Conference on Industrial Informatics (INDIN), Cambridge, UK, Jul. 22-24, 2015, 4 pages.
Guha, A.; Patra, A. State of Health Estimation of Lithium-Ion Batteries Using Capacity Fade and Internal Resistance Growth Models. IEEE Trans. Transp. Electrif. 2018, 4, 135-146, 12 pages.
Zhang, B.; Xu, Y.; Wang, J.; Ma, X.; Hou, W.; Xue, X. Electrochemical performance of LiFePO4/graphene composites at low temperature affected by preparation technology. Electrochim. Acta 2021, 368, 137575, 7 pages.
Hu, Z.; Lu, Z.; Song, B.; Quan, Y. Impact of test cycle on mass, No. and particle size distribution of particulates emitted from gasoline direct injection vehicles. Sci. Total Environ. 2021, 762, 143128, 12 pages.
Rao, K.D.; Chander, A.H.; Ghosh, S. Robust Observer Design for Mitigating the Impact of Unknown Disturbances on State of Charge Estimation of Lithium Iron Phosphate Batteries Using Fractional Calculus. IEEE Trans. Veh. Technol. 2021, 70, 3218-3231, 14 pages.
Lee, C.C.; Hu, P.; Li, C.Y.; Wang, S.H. State of Charge Estimation of the Lithium-ion Battery based on Neural Network in Electric Vehicles. In Proceedings of the 2022 IEEE International Symposium on Product Compliance Engineering—Asia (ISPCE-ASIA), Guangzhou, China, Nov. 4-6, 2022, 3 pages.

* cited by examiner

METHOD FOR ESTIMATION OF STATE OF CHARGE AND STATE OF HEALTH IN A LITHIUM-ION BATTERY PACK, AND SYSTEM THEREOF

FIELD OF THE INVENTION

The present invention pertains to battery management, specifically focusing on a method for estimating the State of Charge (SOC) and State of Health (SOH) of lithium-ion batteries in electric vehicles using Nonlinear State Space Reconstruction (NSSR) with Long Short-Term Memory (LSTM) neural networks to analyze battery operational data.

BACKGROUND OF THE INVENTION

The imperative to advance vehicle power and energy systems has intensified due to the growing focus on reducing carbon emissions and the escalating costs associated with fossil fuels. To achieve these ambitious goals, the exploration of state-of-the-art, eco-friendly technologies is essential. Consequently, research into electric vehicles (EVs), which harness electricity and electric motors for propulsion in lieu of internal combustion engines, has surged. EVs, in theory, could achieve zero emissions, positioning them as a more eco-friendly alternative to conventional fossil fuel vehicles. Within an EV, the battery serves as a pivotal subsystem, storing energy similarly to how a fuel tank does in fossil fuel vehicles, albeit through a more complex mechanism where electricity is chemically stored and later converted back to power the vehicle. However, unlike fuel tanks, battery performance and capacity decline over time due to aging, influenced by temperature fluctuations, usage patterns, and manufacturing variances. Monitoring a battery's State of Charge (SOC) and State of Health (SOH)—key indicators of available capacity and maximum energy storage, respectively—is vital for the performance and safety of the EV but poses a significant challenge since they cannot be directly measured and are typically estimated through algorithms. Notably, the estimation of SOC and SOH is interdependent; deterioration in SOH can impact SOC estimation, and inaccuracies in SOC can skew SOH figures. These estimates are also dependent upon battery architecture and type.

Among the various battery technologies, lithium-ion batteries (LIBs) stand out as the leading choice for EV energy storage due to their superior energy density, extended lifecycle, robust safety, and minimal self-discharge. To meet the power and capacity requirements of EVs, it is customary to connect numerous LIBs in series and parallel arrangements, forming complex battery pack systems. Accurate SOC and SOH estimation across these packs, rather than for individual cells, is critical to the safe operation of the EV. Ideally, all cells would be uniform, simplifying SOC and SOH estimation. Nonetheless, inevitable variations from the manufacturing process have led to disparities in cell characteristics. Moreover, battery aging is a nonlinear progression, affected by multiple factors, including operational conditions and time. Thus, even with a battery pack initially composed of identical cells, consistent characteristics over time are not assured. This underscores the necessity for developing precise and reliable algorithms for SOC and SOH estimation that consider such discrepancies, ensuring the effective management and safety of EVs.

SUMMARY OF THE INVENTION

According to a first aspect of the invention, there is provided a machine learning method of estimating State of Charge (SOC) and State of Health (SOH) of a battery pack, the method comprising collecting a plurality of time-series data related to operational parameters of a battery pack; processing said collected time-series data utilizing a Nonlinear State Space Reconstruction (NSSR) algorithm to reconstruct a first phase state space reconstruction; training a first Long Short-Term memory (LSTM) neural network model using the first phase state space reconstruction for predicting SOH of said battery pack; feeding said time-series data to the first LSTM neural network to predict an estimated SOH value of the battery pack; processing the time-series data utilizing said NSSR algorithm to reconstruct a second phase state space reconstruction; training a second LSTM neural network model using the second phase state space reconstruction, taking into account said estimated SOH value, for predicting SOC of the battery pack; feeding the time-series data and said estimated SOH value of the battery pack to the second LSTM neural network to obtain an estimated SOC value.

In one embodiment, accuracy of said estimated SOH value and said estimated SOC value is evaluated using a testing dataset, wherein the training of the first and second LSTM models continues until the accuracy reaches a predetermined threshold.

In one embodiment, the training step of each of the first and second LSTM neural network models involves validating the trained model using a testing dataset and calculating the root mean square error (RMSE) between said estimated SOH and SOC values and testing SOH and SOC values, and refining the LSTM neural network models based on the RMSE.

In one embodiment, the step of validating is focused on the middle and late periods of the cycle life of the battery pack.

In one embodiment, the step of validating is performed using a constant 1 C rate of charge/discharge.

In one embodiment, the time-series data are collected from a battery management system (BMS) integrated with the battery pack, the BMS being configured to record the operational parameters at predetermined intervals during charging and discharging cycles of the battery pack.

In one embodiment, the NSSR includes determining a delay time and an embedding dimension for reconstructing the phase state spaces based on the collected time-series data.

In one embodiment, the method further comprises normalizing the collected time-series data prior to processing with the NSSR.

In one embodiment, the NSSR algorithm reduces the interference of instantaneous noises through a delayed phase state space.

In one embodiment, the SOC is estimated continuously in real-time during operation of the battery pack and the SOH is estimated at the start or end of a charging cycle.

According to a second aspect of the invention, there is provided a system for estimating the State of Charge (SOC) and State of Health (SOH) of a battery pack using machine learning, comprising a data acquisition module configured to collect time-series data related to operational parameters of the battery pack; a data processing module incorporating a Nonlinear State Space Reconstruction (NSSR) algorithm configured to reconstruct the time-series data to a first reconstruct phase state space for SOH estimation and a second reconstruct phase state space for SOC estimation; an estimation module comprising a first Long Short-Term Memory (LSTM) neural network model configured for SOC estimation and a second LSTM neural network model configured for SOH estimation, based on the first and second reconstruct phase state space; a training module for training the first and second LSTM neural network models, wherein the first LSTM neural network model is configured to be trained using the first reconstruct phase state space as input to predict an estimated SOH value; wherein the second LSTM neural network model is configured to be trained using the second reconstruct phase state space as input and taking into account said estimated SOH value, to predict an estimated SOC value; wherein accuracy of said estimated SOH value and said estimated SOC value is evaluated using testing data, the training of the first and second LSTM models continues until the accuracy reaches a predetermined threshold.

In one embodiment, the system further comprises a validation module configured to validate the trained model using a testing dataset and calculate the root mean square error (RMSE) between said estimated SOH and SOC values and testing SOH and SOC values, and refine the LSTM neural network models based on the RMSE.

In one embodiment, the validation is performed using a constant 1 C rate of charge/discharge.

In one embodiment, the NSSR algorithm is configured to determine a delay time and an embedding dimension for reconstructing the phase state spaces based on the collected time-series data.

In one embodiment, the data processing module is configured to perform normalization of the time-series data prior to processing with the NSSR algorithm to mitigate the influence of outliers.

In one embodiment, the NSSR algorithm is configured to reduce the interference of instantaneous noises through a delayed phase state space.

In one embodiment, the system is configured to estimate the SOC continuously in real-time during operation of the battery pack and to estimate the SOH at the start or end of a charging cycle.

In one embodiment, the training module is configured to perform adjustment of the LSTM neural network model parameters based on environmental factors including the temperature of working condition.

In one embodiment, the training module is configured to input a state vector comprising a plurality of SOC and/or SOH values from previous time steps into the first and the second LSTM neural network models.

BRIEF DESCRIPTION OF THE DRAWINGS

The present invention will now be more specifically described by way of example only with reference to the accompanying drawings, in which.

The figures herein are for illustrative purposes only and are not necessarily drawn to scale. The original Abstract has been shortened to comply with the word count limit. The original in full read: "A machine learning method of estimating State of Charge (SOC) and State of Health (SOH) of a battery pack, the method comprising collecting a plurality of time-series data related to operational parameters of a battery pack; processing the collected time-series data utilizing a Nonlinear State Space Reconstruction (NSSR) algorithm to reconstruct a first phase state space reconstruction; training a first (Long Short-Term memory) LSTM neural network model using the first phase state space reconstruction for predicting SOH of said battery pack; feeding the time-series data to the first LSTM neural network to predict an estimated SOH value of the battery pack; processing the time-series data utilizing said NSSR algorithm to reconstruct a second phase state space reconstruction; training a second LSTM neural network model using the second phase state space reconstruction, taking into account the estimated SOH value, for predicting SOC of the battery pack, and feeding the time-series data and the estimated SOH value of the battery pack to the second LSTM neural network to obtain an estimated SOC value. A system configured to perform the above method is also disclosed."

DESCRIPTION OF THE PREFERRED EMBODIMENTS

The following clearly and completely describes the technical solutions in the embodiments of the present invention with reference to the accompanying drawings. Apparently, the described embodiments are merely some but not all of the embodiments of the present invention. All other embodiments based on the embodiments of the present invention and obtained by a person of ordinary skill in the art without investing creative efforts shall fall within the scope of the present invention.

Figure 1:
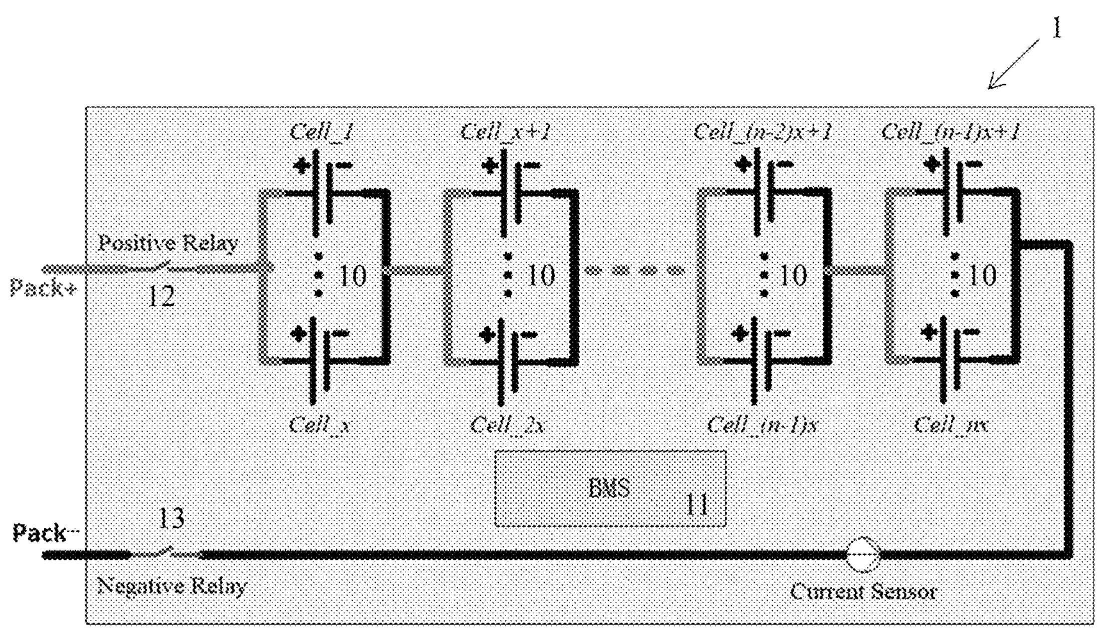
FIG. 1 shows a schematic diagram of a typical lithium-ion battery pack used in an EV.

The joint estimation of the State of Charge (SOC) and State of Health (SOH) of battery packs in electric vehicles (EVs) is presented in the present invention through the application of nonlinear state space reconstruction-long short-term memory (NSSR-LSTM) neural networks. The process begins with the analysis and extraction of impact factors related to battery pack inconsistencies in EVs, conducted via experimental methods. These identified factors are then utilized by estimation algorithms, predicting SOC values based on them. During the estimation process, nonlinear state space reconstruction (NSSR) is employed to construct a new phase state space, enhancing the stability of the input variables. This NSSR is then integrated with long short-term memory (LSTM) to develop the estimation model, leveraging the capacity of LSTM for memorizing historical data. Significant contributions to the SOC and SOH estimation of battery packs are made through several key steps:

1. An experimental testbed is established, allowing for the measurement of SOC and SOH in battery packs under various criteria and configurations. This testbed captures data from thousands of charging and discharging cycles.
2. Appropriate parameters for input into machine learning models are evaluated using experiments conducted on this testbed. These experiments encompass various temperatures (between 40° C. and −10° C.) and charging/discharging patterns.
3. A machine learning model based on LSTM is developed for the co-estimation of SOC and SOH. To enhance estimation accuracy, the nonlinear state space reconstruction (NSSR) approach is incorporated into this model.
4. The accuracy of the proposed NSSR-LSTM method for co-estimating SOC and SOH is validated through comparison with experimental measurement results on a high-voltage battery pack (as depicted in FIG. 1, where x=4 and n=112). This comparison demonstrates the significant improvement in accuracy achieved by the NSSR-LSTM method in estimating SOC and SOH of EV battery packs.

FIG. 1 illustrates the typical structure of a battery pack 1 in an electric vehicle (EV). This battery pack 1 is composed of multiple lithium-ion battery (LIB) cells, organized in a specific arrangement. The structure includes 'n' groups 10 of battery cells, with each group 10 containing 'x' cells connected in parallel. Each individual battery cell is characterized by a maximum voltage of $V_c$ volts and a maximum current capacity of Ac amperes. Therefore, the entire battery pack 1 can deliver a maximum voltage of $nV_c$ volts and a maximum current of $xA_c$ amperes.

The operation of the battery pack 1 is meticulously overseen by a Battery Management System (BMS) 11. The primary function of the BMS 11 is to ensure that all battery cells operate within safe voltage, current, and temperature limits. This involves continuous monitoring and management of each individual cell within the battery pack 1. A crucial aspect of the BMS 11 is its capability to measure and estimate the State of Charge (SOC) and State of Health (SOH) of the battery pack 1. These estimations are vital for the appropriate charging and discharging of the battery, ensuring efficiency and longevity.

Furthermore, the BMS 11 is equipped with a current sensor. This sensor plays a key role in measuring the charging and discharging currents of the battery pack 1 and conveying this information to the system. In scenarios where there is a risk of overload or overcharge, which could potentially harm the battery pack 1, the BMS 11 intervenes. When necessary, the BMS 11 controls a positive relay 12 and a negative relay 13 to effectively disconnect the battery pack 1 from the external system. This safety mechanism is critical in preventing damage to the battery pack 1 and ensuring safe operation of the EV. The subsequent subsections will describe these mechanisms in greater detail, elucidating how the BMS 11 effectively manages and protects the battery pack 1 in EVs.

Estimation of State of Charge (SOC)

As previously discussed, the State of Charge (SOC) is an indicator of the remaining capacity of a battery, typically expressed as a percentage. This percentage is determined by dividing the current available capacity by the nominal capacity of the battery. The SOC is calculated using a mathematical formula that considers various parameters:

$$SOC_{(t_0+1)} = SOC_{(t_0)} + \eta \frac{\int_{t_0}^{t_0+1} I(t)dt}{C_{(N)}},$$

where:

$SOC_{(t0+1)}$ denotes the SOC at a later time $t_0+1$, $SOC_{(t0)}$ indicates the SOC at an earlier time $t_0$, $\eta$ represents the efficiency of the charging and discharging processes of the battery, $I_{(t)}$ refers to the current at time t during charging or discharging, and $C_{(N)}$ is the nominal capacity of the battery pack 1.

This formula provides a way to track the change of SOC of the battery pack 1 over time, accounting for battery efficiency and usage patterns.

In the field of electric vehicle (EV) battery pack SOC estimation, four prevalent methods are recognized. These include the ampere-hour (Ah) integral approach, methods based on Open Circuit Voltage (OCV) lookup tables, techniques that combine filter algorithms with equivalent circuit models, and approaches grounded in data-driven algorithms. The ampere-hour integral approach, notable for calculating SOC by integrating current over time, faces challenges in accuracy due to potential errors in current sensor measurements. These inaccuracies can accumulate over time, particularly during the charging and discharging phases of the battery. A significant reliance on the accuracy of the initial SOC value is another limitation of this method, necessitating its combination with other calibration algorithms to mitigate open-loop issues.

Other methods have been proposed to refine the OCV-SOC estimation technique, including models that consider varying temperatures. Despite improvements, these methods require a static environment to accurately measure OCV, a requirement that can be problematic over the operational life of a battery in an EV. Filter algorithms, such as the Extended Kalman Filter and the Unscented Kalman Filter, have been merged with equivalent circuit models to enhance SOC estimation accuracy. While these show an improvement over the Ah integral method, maintaining accuracy across the lifespan of the battery pack remains a challenge.

Neural network-based SOC estimation methods have gained attention, with various approaches being explored. These include the use of neural networks for predicting battery health, combined with Ah integral methods for SOC estimation. Dual-Input Neural Networks and neural network bank algorithms have been investigated, along with the integration of Auto-encoders and LSTM networks. Multilayer neural networks have also been employed to estimate both SOC and SOH. However, these methods primarily focus on individual cell SOC estimation and face challenges in addressing the inconsistencies of the entire battery pack. It should be noted that these inconsistencies in battery packs arise from both internal and external parameters of the cells. Internal factors include capacity, internal resistance, OCV, and SOC variations originating from manufacturing and assembly processes. External factors, such as temperature and current variations among cells, also contribute significantly to these inconsistencies in practical applications.

Estimation of State of Health (SOH)

The State of Health (SOH) is a critical factor for assessing the health of Lithium-Ion Batteries (LIBs), yet it lacks a standardized definition. Generally, SOH is characterized in three ways: internal resistance, cycle life, and battery capacity. The first approach, internal resistance, compares the initial and aged states of the internal resistance of a battery. Cycle life, another SOH indicator, is determined by comparing the cumulative capacity of the battery to its nominal capacity, representing the number of charge-discharge cycles a battery undergoes. The third type, based on battery capacity, measures SOH as the percentage difference between the capacity of a battery at its initial and aged states. Among these, the capacity-based SOH definition is most commonly used and is mathematically represented as:

$$SOH_{(N)} = \frac{Cap_{(now)}}{Cap_{(initial)}},$$

where $Cap_{(now)}$ indicates the current maximum capacity, $Cap_{(initial)}$ represents the initial capacity of the newest battery, and $SOH_{(N)}$ indicates the health state after N cycles. While this formula appears straightforward, accurately estimating SOH remains challenging due to the complex nature of lithium-ion battery degradation and varying external conditions. Technically, SOH estimation methods are primarily divided into two categories: model-based and data-driven. Model-based approaches utilize physical or electrochemical characteristics, whereas data-driven methods rely on mathematical relationships of key parameters, independent of the battery model.

Several model-based SOH estimation methods have been previously developed. These include a fused fading model considering capacity decay and resistance increase, a voltage drop method using linear correlation, and an enhanced coulomb counting method incorporating depth-of-discharge (DOD) and SOC. However, practical application challenges, like obtaining DOD and coulomb efficiency, limit these methods. Advanced methods like the 4th-order Extended Kalman Filter (EKF) and Dual Extended Kalman Filter (DEKF) attempt to combine equivalent circuit models with physical descriptions, but accurately representing the electrochemical characteristics of LIB remains complex.

On the other hand, with advancements in computer technology, machine learning and deep learning have emerged as vital data-driven methods for SOH estimation. Techniques like bidirectional long- and short-term memory (Bi-LSTM) combined with incremental capacity analysis, probabilistic neural networks, convolutional neural networks, and recurrent neural networks have been explored. However, these approaches often focus on individual cells, overlooking SOH estimation for entire battery packs. To overcome these limitations, the present invention proposes a machine learning NSSR-LSTM model, considering both SOC and SOH estimation for battery packs and enhancing estimation stability.

The following section will describe the experimental setup and the methodologies employed to extract key features necessary for the development and validation of the NSSR-LSTM model for estimating the State of Charge (SOC) and State of Health (SOH) of lithium-ion batteries in electric vehicles (EVs) according to the present invention.

Figure 2:
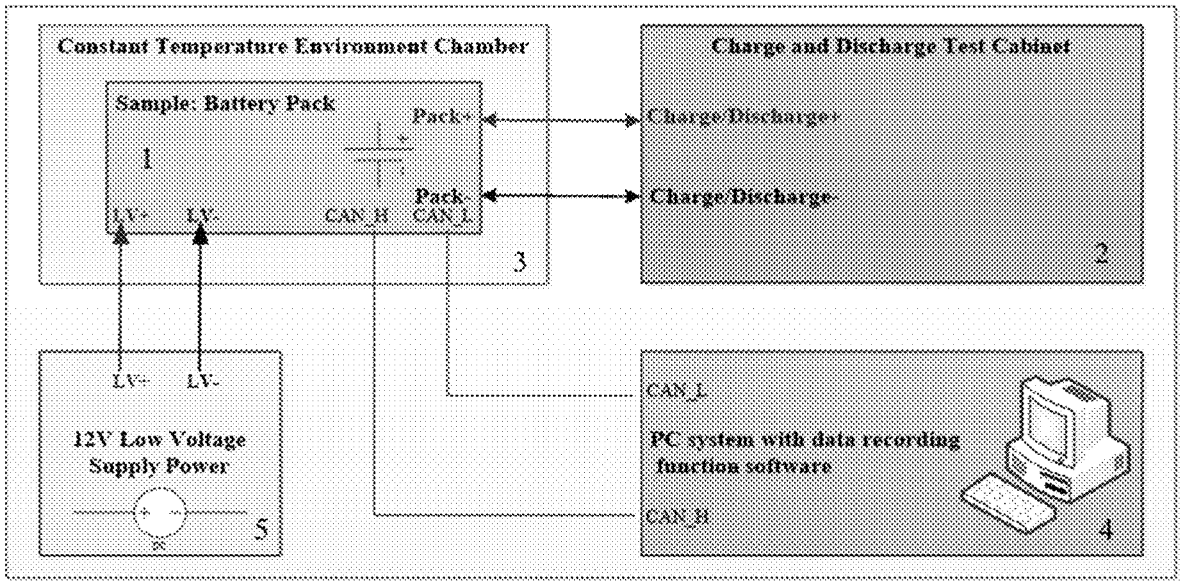
FIG. 2 shows schematics diagram of a testbed used for acquiring datasets.

As illustrated in FIG. 2, the test equipment setup includes a collection of charge and discharge cabinets 2, constant temperature equipment 3, a personal computer (PC) and Controller Area Network (CAN) bus tool 4, and a 12V low voltage supply power 5. The battery pack 1 tested comprised LiFePO4 (LFP) 52 Ah rectangular aluminum shell batteries, chosen for their uniformity and minimal performance variation, typical of electric vehicle batteries. This setup was designed to replicate charger and vehicle loads under various environmental temperatures. This particular setup allows for precise control and monitoring of the battery pack 1, preferably mirroring real-world EV operating conditions. The experiments covered a range of scenarios, each designed to simulate different aspects of EV battery operation, from the impact of temperature on battery performance to the cycle life of individual cells and complete battery packs. These scenarios provided a wealth of data that was instrumental in understanding the complexities of battery behavior under various conditions. The meticulous recording and analysis of voltage, current, and temperature measurements under these scenarios have yielded insights into the fundamental dynamics governing battery performance and longevity. Special attention was given to replicating real-world conditions to ensure the relevance and applicability of the results. The data collected provide a rich dataset for analysis and model training. The detailed experimental setup and methodologies form the backbone of the development of the NSSR-LSTM model for accurately estimating the State of Charge (SOC) and State of Health (SOH) of lithium-ion batteries in electric vehicles (EVs). This rigorous and methodical approach to data collection, feature extraction, and analysis, ensures the robustness and applicability of the NSSR-LSTM model in real-world scenarios.

Figure 3:
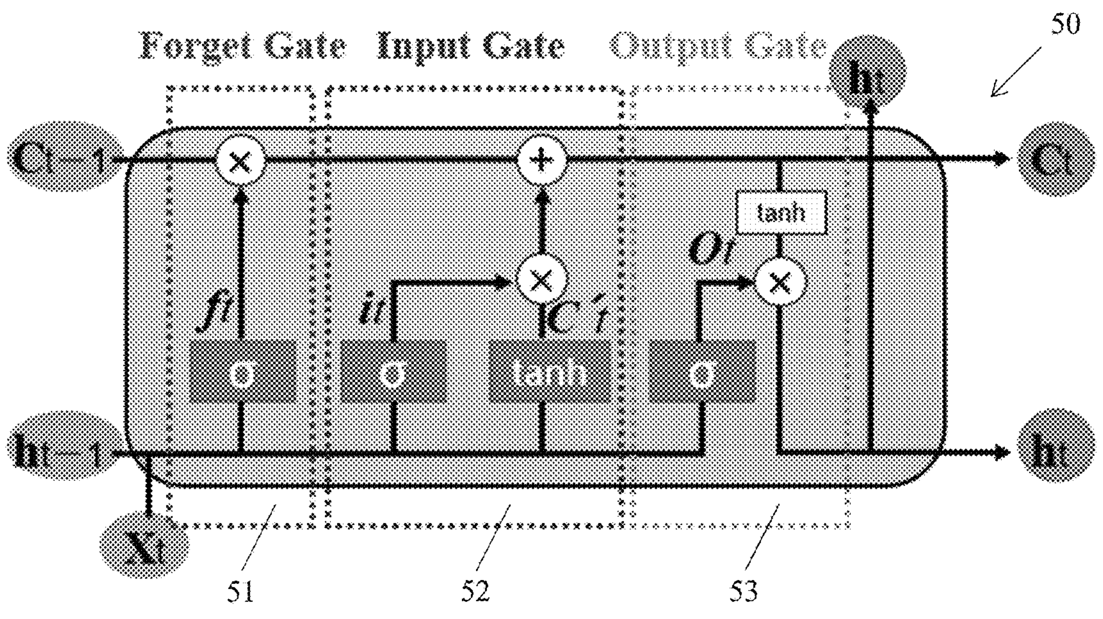
FIG. 3 shows a schematic diagram of an LSTM neural network.

Long Short-Term Memory (LSTM) neural networks are capable of establishing the functional relationship between various battery parameters through data training, independently of any pre-established physical correlations. FIG. 3 illustrates the intricate internal structure of the LSTM neural network, which is composed of three critical gates: the forget gate, input gate, and output gate. Each of these gates comprises a number of neurons, and their training is influenced by both the most recent inputs and the outputs from previous steps. The forget gate plays a crucial role in determining which pieces of information from the preceding time step should be retained or discarded. Concurrently, the input gate is responsible for identifying and integrating new information into the cell state. The output gate is tasked with selecting the information that will be conveyed as the final output of the network. By systematically training the LSTM neural network using pairs of input and output data related to battery parameters, the network gradually learns to discern the underlying functional relationships. This enables the network to make predictions for new input scenarios. A key strength of the LSTM network is its ability to capture and utilize long-term dependencies, which involves considering both historical inputs and outputs. This attribute is particularly crucial for the precise prediction of battery parameters, ensuring the effectiveness of the network in dynamic and evolving operational environments.

The forget gate in LSTM neural networks, which is typically based on a sigmoid function, has a pivotal role in deciding what historical information to keep and what to discard. It processes inputs from the previous hidden state (denoted as $h_{t-1}$), which contains historical information, and the current input (denoted as $X_t$). The forget gate computes a vector with values ranging from 0 to 1. These values are crucial in determining the extent to which each element from the previous hidden state should be forgotten or retained. The mathematical expression for the forget gate can be represented as:

$$f_t = \sigma(V_f h_{t-1} + W_f X_t + B_f),$$

where $V_f$ presents the weight of $h_{t-1}$, $W_r$ presents the weight of $X_r$, and $B_f$ presents the bias. A sigmoid activation function, denoted as σ, producing outputs restricted between 0 and 1, can be expressed as:

$$\sigma = \frac{1}{1 + e^{-x}}$$

As a result, it can make use of adopting and neglecting some previous information. Subsequently, the reserved information will be stored in the cell state. The input gate, another critical component, manages input information. It consists of two parts: one derived from the σ activation function and the $C_{t'}$ from the tan h function. Additionally, the cell state $C_t$ is updated based on the information processed by both the forget gate and the input gate. The relevant mathematical relationships can be expressed as follows:

$$i_t = \sigma((V_i \times h_{t-1}) + (W_i \times X_t) + B_i),$$

$$C'_t = \tan h((V_c \times h_{t-1}) + (W_c \times X_t) + B_c),$$

where tan h can be expressed as:

$$\tan h = \frac{e^x - e^{-x}}{e^x + e^{-x}}$$

The cell state $C_t$ is updated to integrate relevant details from the old cell state $C_{t-1}$, the forget gate, and the input gate, which can be expressed as:

$$C_t = (C_{t-1} \times f_t) + (i_t \times C'_t)$$

This updated state is an incorporation of past and current information, crucial for the memory of the network. The output gate provides the result $h_t$ based on the output from the gate $O_t$ and the most recent cell state. The expressions for $O_t$ and $h_t$ are defined through respective formulas, as follows:

$$O_t = \sigma((V_O \times h_{t-1}) + (W_O \times X_t) + B_O),$$

$$h_t = O_t \times \tan h(C_t)$$

Figure 4:
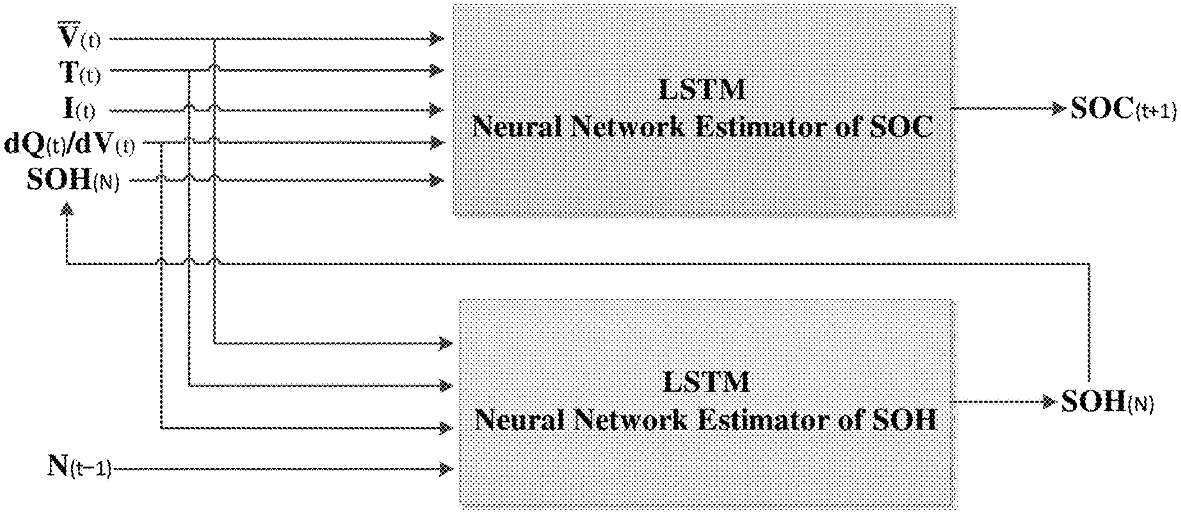
FIG. 4 shows a structure of joint SOC and SOH estimation based only on LSTM.

In the context of estimating the state of health (SOH) and state of charge (SOC) of the battery, key input parameters for the LSTM model will include voltage, temperature, number of cycles, and dQ/dV for SOH, and voltage, current, temperature, dQ/dV, and SOH for SOC. To estimate both SOC and SOH jointly, an LSTM neural network model, as illustrated in FIG. 4, has been proposed. According to the present invention, the nonlinear state space reconstruction (NSSR) technique was subsequently applied to enhance the performance of the model.

Based on Takens theorems, it is possible to create a new phase state space that can stabilize a time-series system using observable state variables. This concept is encapsulated in the below equation:

$$\begin{bmatrix} x_1 \\ x_2 \\ \vdots \\ x_n \end{bmatrix} \xrightarrow{\varphi} y : \begin{bmatrix} x_{1(k-1)*T} \\ x_{1(k-2)*T} \\ x_{1(k-3)*T} \\ \vdots \\ x_{1(k-m)*T} \\ x_{1(k-1)*T} \\ x_{2(k-2)*T} \\ x_{2(k-3)*T} \\ \vdots \\ x_{2(k-m)*T} \\ \vdots \\ x_{n(k-1)*T} \\ x_{n(k-2)*T} \\ x_{n(k-3)*T} \\ \vdots \\ x_{n(k-m)*T} \end{bmatrix}$$

where 'x' represents the previous phase state space and 'y' signifies the newly constructed phase state space. 'T' is used to denote the time delay, while 'm' indicates the number of embedded dimensions. In the context of lithium-ion batteries (LIBs), especially during their charging and discharging processes, the state variables also form a nonlinear time-series system. Hence, applying Nonlinear State Space Reconstruction (NSSR) based on Takens theorems is particularly advantageous for the state estimation of LIBs. NSSR serves a dual purpose in this context: firstly, it stabilizes the state space systems of the LIBs; secondly, it mitigates the impact of instantaneous noise by employing a delayed phase state space.

Figure 5:
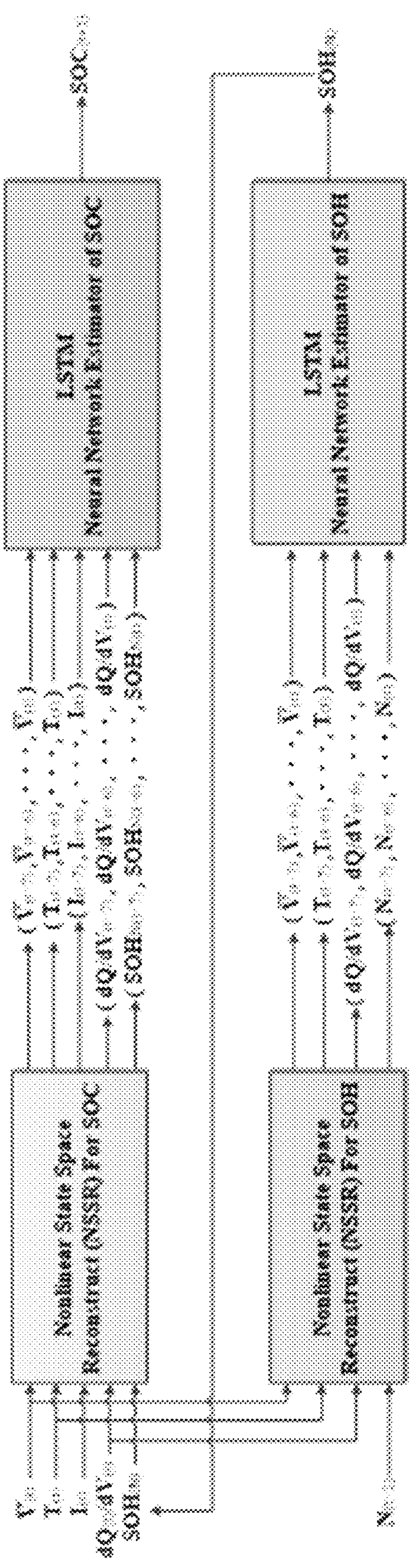
FIG. 5 shows a structure of joint SOC and SOH estimation based on NSSR-LSTM.

The present invention provides a co-estimation method of SOC and SOH based on NSSR-LSTM to address state estimation of batteries pack system. In FIG. 5, the structure of joint SOC and SOH estimation algorithm is presented, and state variables of SOC include mean voltage ($\overline{V}_{(t)}$), minimum temperature ($T_{(t)}$), current ($I_{(t)}$), ratio of capacity increment to voltage increment $$\left(\frac{dQ_{(t)}}{dV_{(t)}}\right),$$

and state of health ($SOH_{(N)}$). The state variables of SOH include mean voltage ($\overline{V}_{(t)}$), minimum temperature ($T_{(t)}$), ratio of capacity increment to voltage increment $$\left(\frac{dQ_{(t)}}{dV_{(t)}}\right),$$

and number of cycles ($N_{(t-1)}$). The state space composed of these state variables will be re-constructed according to NSSR theory. The phase state space reconstruction for SOC and SOH estimation is respectively shown as equations as follows:

$$x: \begin{bmatrix} \nabla_{(t)} \\ T_{(t)} \\ I_{(t)} \\ dQ_{(t)}/d\mathrm{V}_{(t)} \\ SOH_{(N)} \end{bmatrix} \xrightarrow{\varphi} y: \begin{bmatrix} \nabla_{(t-7)} \\ \nabla_{(t-6)} \\ \vdots \\ \nabla_{(t)} \\ T_{(t-7)} \\ T_{(t-6)} \\ \vdots \\ T_{(t)} \\ I_{(t-7)} \\ I_{(t-6)} \\ \vdots \\ I_{(t)} \\ dQ_{(t-7)}/d\mathrm{V}_{(t-7)} \\ dQ_{(t-6)}/d\mathrm{V}_{(t-6)} \\ \vdots \\ dQ_{(t)}/d\mathrm{V}_{(t)} \\ SOH_{N(t-7)} \\ SOH_{N(t-6)} \\ \vdots \\ SOH_{N(t)} \end{bmatrix},$$

$$x: \begin{bmatrix} \nabla_{(t)} \\ T_{(t)} \\ I_{(t)} \\ dQ_{(t)}/d\mathrm{V}_{(t)} \\ SOH_{(N)} \end{bmatrix} \xrightarrow{\varphi} y: \begin{bmatrix} \nabla_{(t-7)} \\ \nabla_{(t-6)} \\ \vdots \\ \nabla_{(t)} \\ T_{(t-7)} \\ T_{(t-6)} \\ \vdots \\ T_{(t)} \\ dQ_{(t-7)}/d\mathrm{V}_{(t-7)} \\ dQ_{(t-6)}/d\mathrm{V}_{(t-)} \\ \vdots \\ dQ_{(t)}/d\mathrm{V}_{(t)} \\ N_{(t-7)} \\ N_{(t-6)} \\ \vdots \\ N(t) \end{bmatrix}$$

The reconstructed phase state space will serve as the primary input for the LSTM neural networks in estimating the State of Health (SOH) and State of Charge (SOC).

Figure 6:
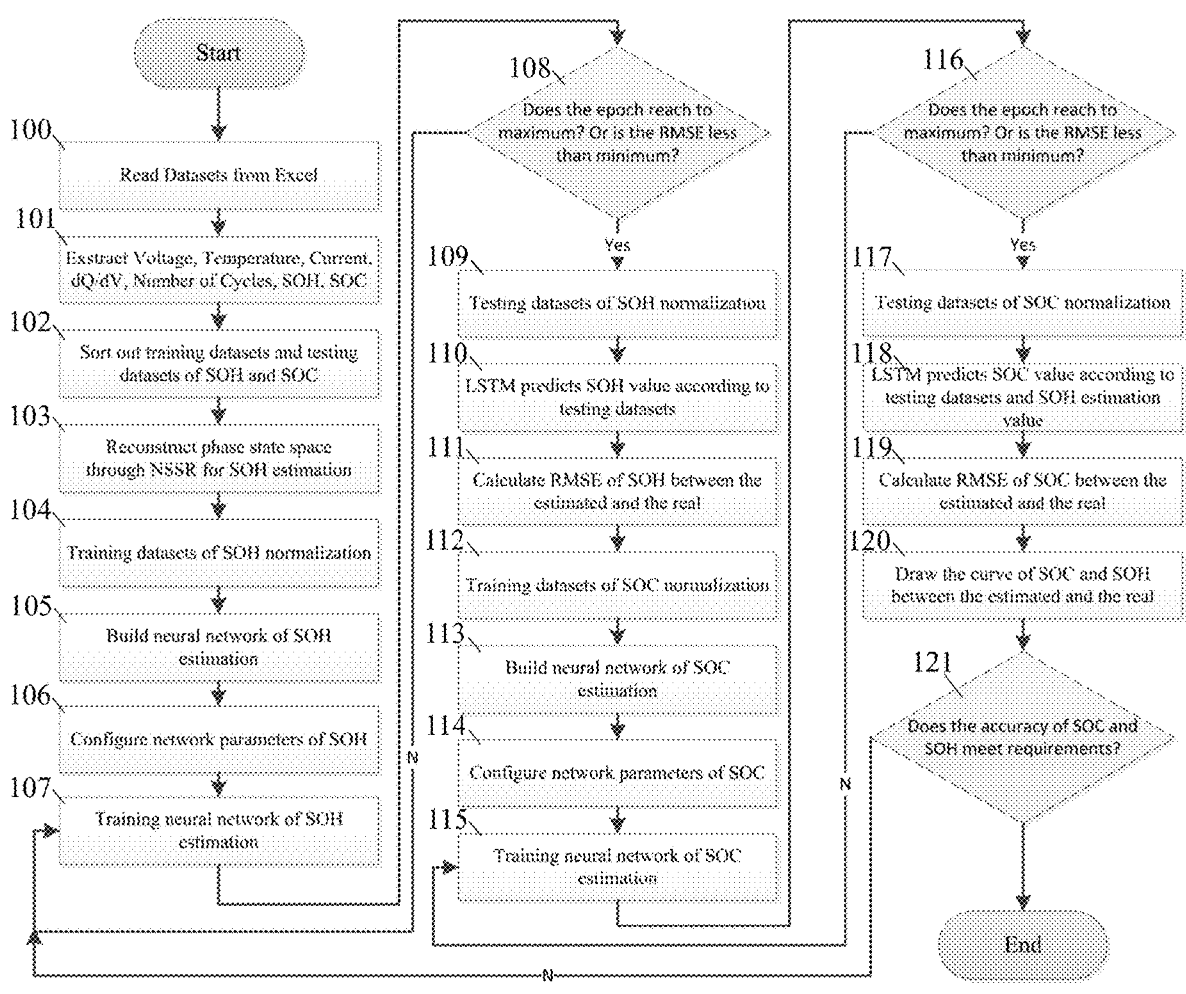
FIG. 6 shows an operation flowchart of joint SOC and SOH estimation based on NSSR-LSTM.

As shown in FIG. 6, the estimation process begins with the collection of experimental time-series data related to the operational parameters of a battery pack. These data are typically gathered by a Battery Management System (BMS) that continuously monitors and collects data from the battery pack. For convenience, the data should preferably be imported into an Excel file (Step 100).

The next step involves extracting specific parameters from the raw data that are relevant for analysis (Step 101). The data include, but are not limited to, voltage, current, dQ/dV, temperature, cycle count, State of Health (SOH), State of Charge (SOC), and so on. The data are then divided into two sets: training datasets used to train neural network models and separate testing datasets for evaluating model performance (Step 102).

The data are processed through a Nonlinear State Space Reconstruction (NSSR) algorithm to create a first-phase state space for estimating SOH (Step 103). To ensure effective training, the training datasets for SOH are normalized (Step 104).

Subsequently, a first Long Short-Term Memory (LSTM) neural network is constructed and configured for SOH estimation (Steps 105, 106). This network is specifically trained using the first-phase state space as input (Step 107). The process reaches a decision point (Step 108) where the training process is evaluated based on criteria such as whether the epoch has reached a maximum number of complete passes through the training dataset set before training began. Alternatively, the evaluation may be based on the accuracy of SOH predictions, calculated using the root mean square error (RMSE) formula:

$$\text{RMS}\,E_{(y)} = \sqrt{\frac{1}{n}\sum_{i}^{n}(y_i - \bar{y}_i)^2}$$

Preferably, the training process of the first LSTM neural network (Step 107) repeats if the RMSE exhibits a decrease compared to a previous value before reaching a predetermined minimum value. The training process stops when the RMSE of SOH no longer significantly decreases or reaches the minimum value. Following the training process, the testing datasets undergo normalization to ensure consistency and reduce the impact of outliers (Step 109). Next, the testing datasets are fed into the first LSTM neural network, now trained to a certain level of accuracy, to obtain an estimated value of SOH (Step 110). At this point, RMSE is calculated to validate the estimated SOH against actual measured values (Step 111).

In a parallel process, the time-series data undergoes NSSR again, this time to create a second-phase state space for estimating SOC (Step 112). The training datasets for predicting SOC are then normalized (Step 112), and a second LSTM neural network is constructed and configured for SOC estimation (Steps 113, 114). In particular, the second LSTM network incorporates the previously estimated SOH from Step 110 as one of the input parameters.

Similar to the SOH estimation process, the training of the second LSTM neural network repeats if RMSE exhibits a decrease compared to a previous value. Ideally, the training process stops at Decision Point 116 when RMSE for SOC no longer significantly decreases. Following the training process, the testing datasets for SOC undergo normalization to ensure consistency and reduce the impact of outliers (Step 117). Accordingly, the testing datasets are fed into the second LSTM neural network, now trained to a certain level of accuracy, along with the previously obtained estimated SOH value, to obtain an estimated SOC value (Step 118). At this point, RMSE may be determined between the estimated SOC value and the actual measured value of SOC obtained from the testbed, for further validation (Step 119).

To facilitate the effective training and testing of these LSTM models, it is essential to collect and analyze experimental data encompassing such parameters as voltage, current, temperature, number of cycles, SOH, and SOC. As shown, the training step of each of the first and second LSTM neural network models further involves validating the trained model using a testing dataset and calculating the root mean square error (RMSE) between the estimated SOH and SOC values and testing SOH and SOC values, and refining the LSTM neural network models based on the RMSE.

Optionally, the process includes plotting curves of the estimated SOH and SOC values against actual measured values obtained from the experimental testbed (Step 120). These curves provide a visual representation of the models' performance in estimating SOH and SOC. If the performance meets accuracy requirements, the process is considered complete, and it is then ready to estimate the SOC and SOH of a battery pack by the method according to the present invention and a system configured to carry out such a method.

To further corroborate the effectiveness of the NSSR-LSTM-based joint estimation algorithms, attention was directed towards the more challenging middle and late stages of the battery cycle life. These stages are often difficult for estimation algorithms due to the influence of battery degradation factors. For accuracy evaluation, data from the 700th and 800th cycles of the battery pack were utilized. The NSSR-LSTM neural networks were configured with 150 hidden layers, and the algorithms were executed using MATLAB 2018b on a single GPU. The training was concluded once the root means square error (RMSE) for SOH and SOC on the validation datasets ceased to show significant reductions.

Figure 7A:
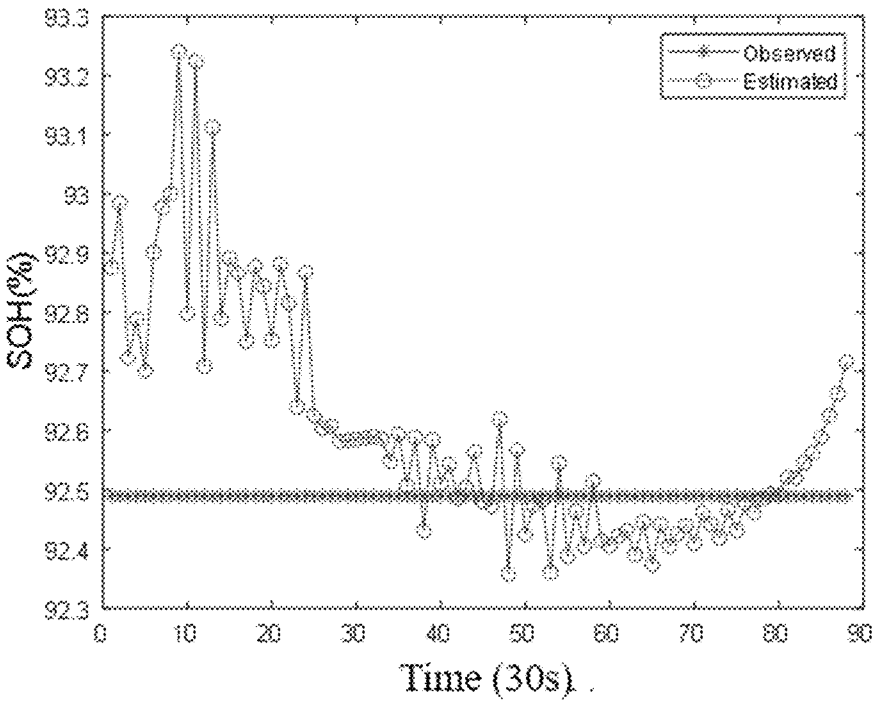
FIG. 7*a* is a graph showing SOH comparison of the 700th round between the joint estimation of NSSR-LSTM and the measured value.
Figure 7B:
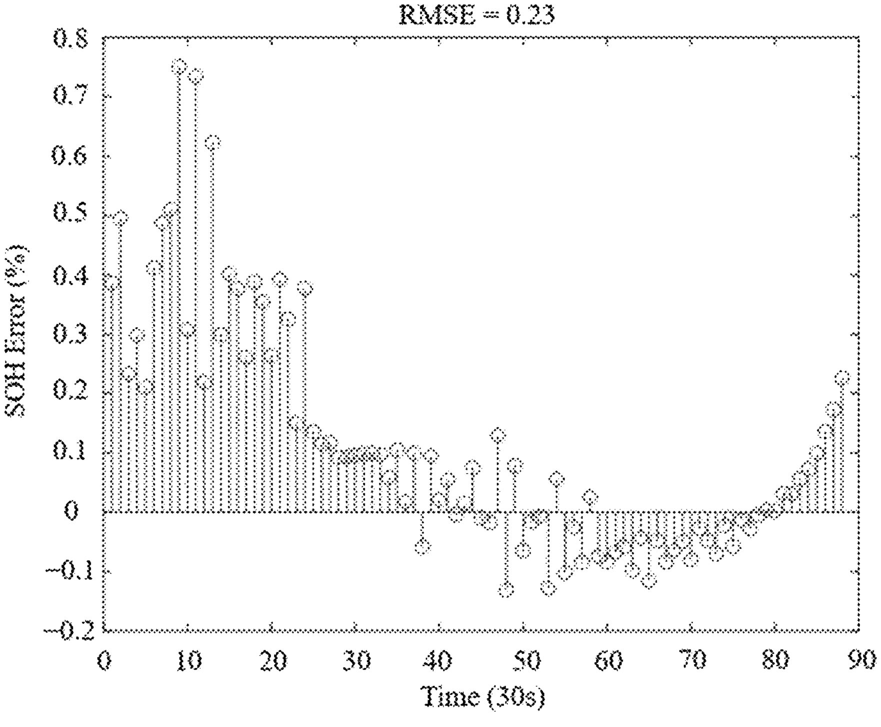
FIG. 7*b* is a graph showing SOH RMSE of the 700th round of the joint estimation of NSSR-LSTM.
Figure 8A:
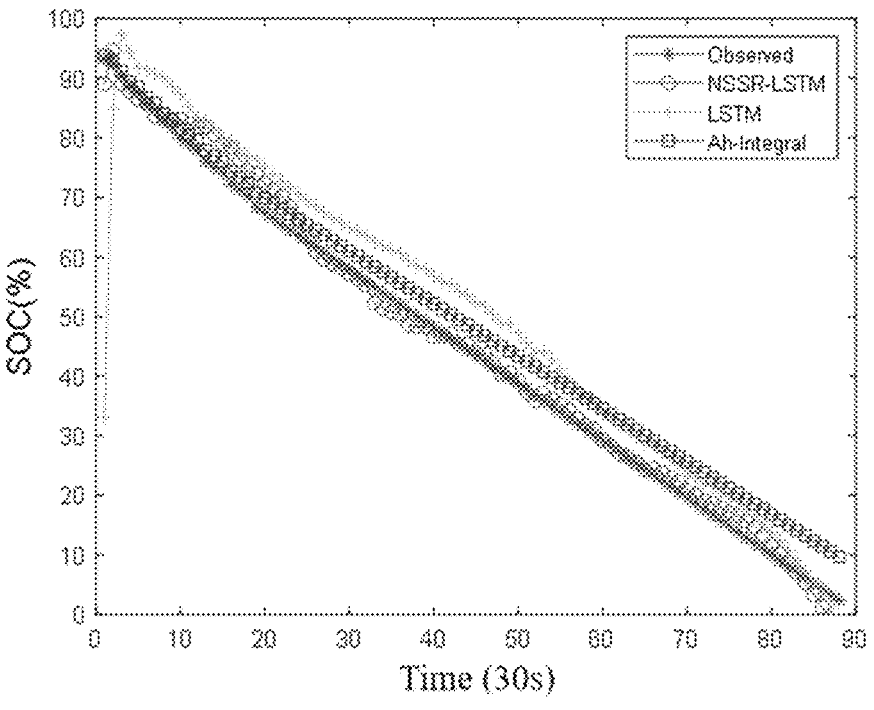
FIG. 8*a* is a graph showing SOC comparison of the 700th round between the joint estimation of NSSR-LSTM method, the LSTM only method, the Ah-integral method and the measured value.
Figure 8B:
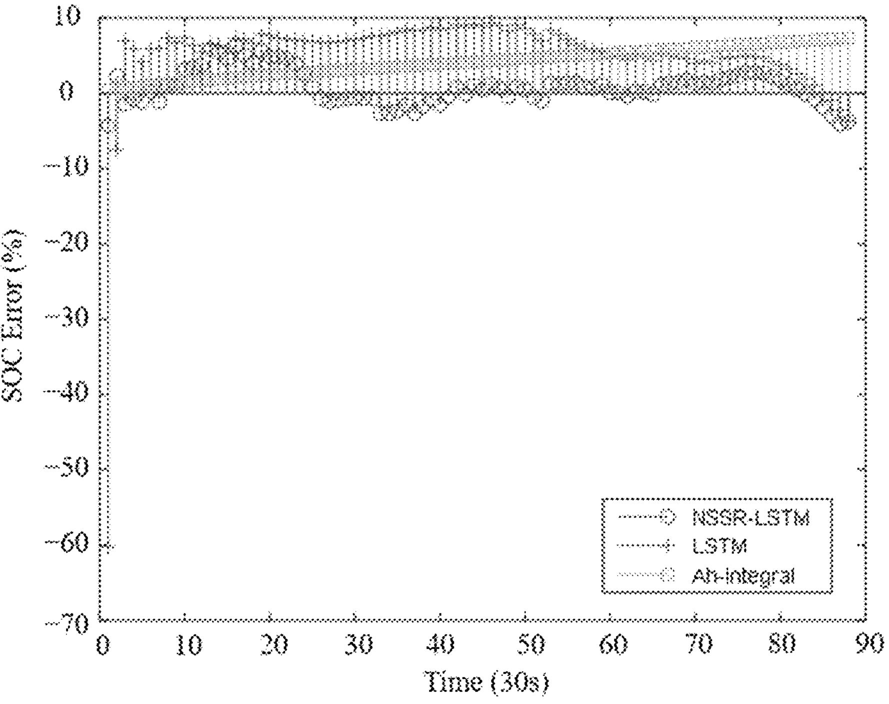
FIG. 8*b* is a graph showing SOC RMSE comparison of the 700th round between the joint estimation of NSSR-LSTM, the LSTM only method and the Ah-Integral method.

The RMSE for SOH estimation at the 700th cycle was recorded at 0.23%, as illustrated in FIG. 7*a* and FIG. 7*b*. Throughout various points in the 700th cycle, the SOH estimation accuracy consistently remained within 0.8%. When employing the NSSR-LSTM method (depicted in FIG. 6), the SOC RMSE for the 700th cycle was observed to be 2.41%. This performance was notably superior compared to the 4.57% RMSE yielded by the ampere-hour (Ah) integral method and the 9.13% RMSE from the LSTM-only approach (shown in FIG. 4). The SOC estimation results, along with their comparisons, are presented in FIG. 8*a* and FIG. 8*b*. The NSSR-LSTM-based joint estimation demonstrates remarkable accuracy in SOC estimation, particularly during the advanced aging phase of the 700th cycle. The precision in SOH estimation, when used as an input parameter, significantly enhances the SOC estimation accuracy for the battery packs. Furthermore, the SOC predictions achieved through the NSSR-LSTM joint estimation outperform those from the Ah-integral and LSTM-only methods, underscoring the effectiveness of this approach.

Figure 9A:
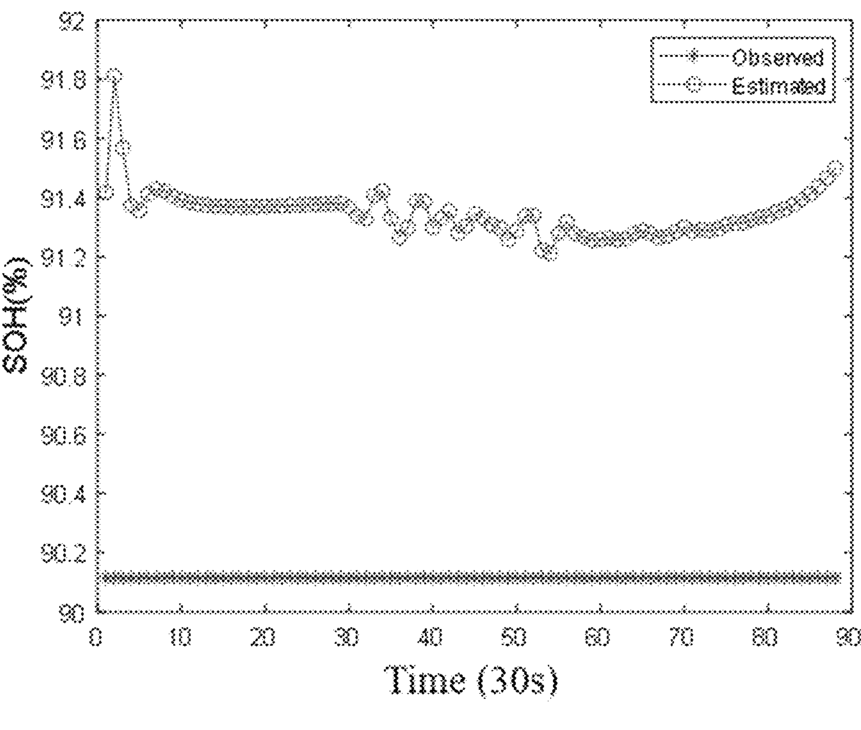
FIG. 9*a* is a graph showing SOH comparison of the 800th round between the joint estimation of NSSR-LSTM and the measured value.
Figure 9B:
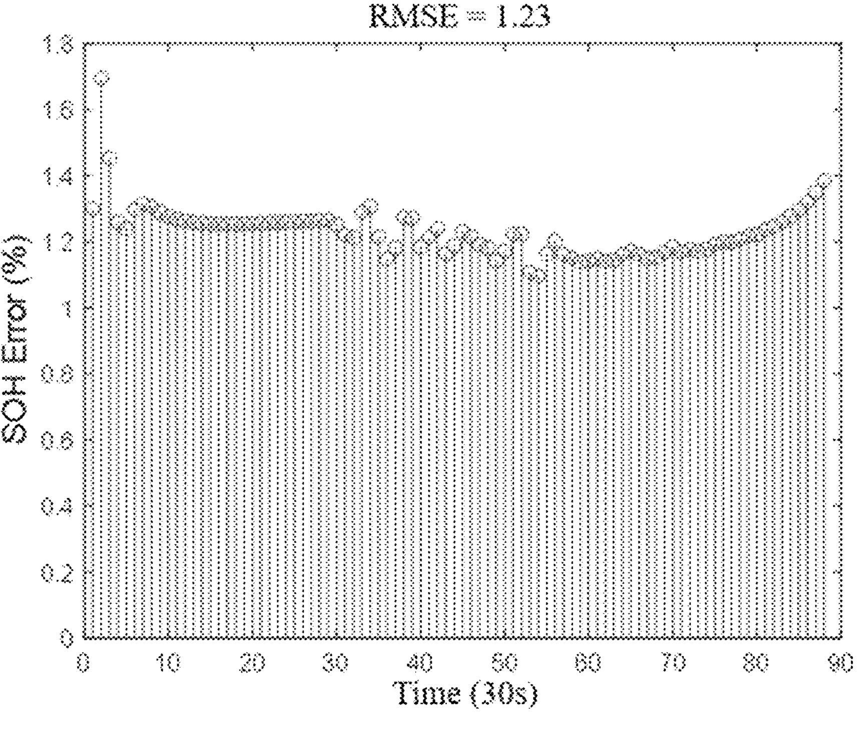
FIG. 9*b* is a graph showing SOH RMSE of the 800th round of the joint estimation of NSSR-LSTM.
Figure 10A:
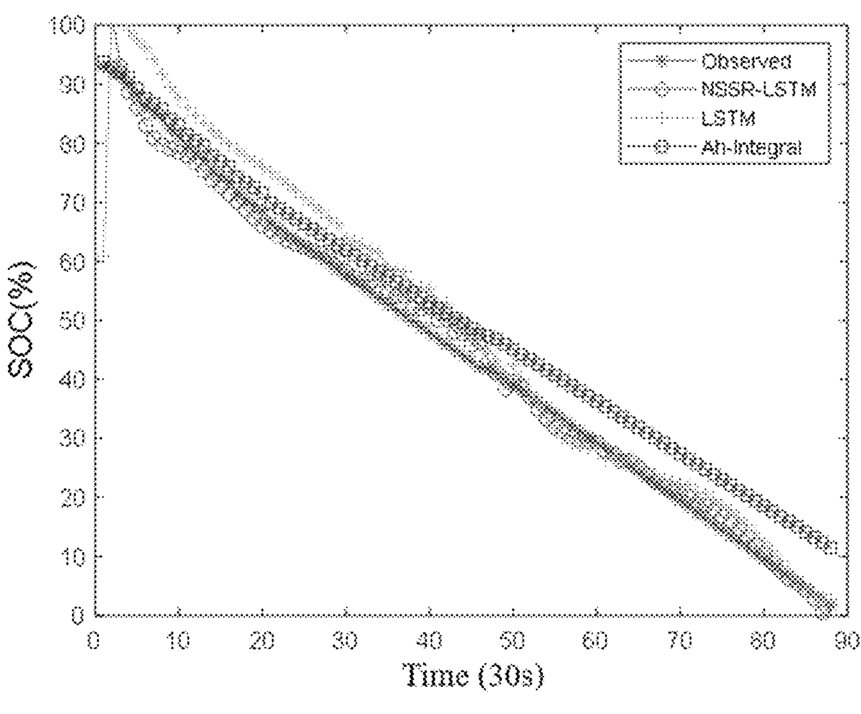
FIG. 10*a* is a graph showing SOC comparison of the 800th round between the joint estimation of NSSR-LSTM method, the LSTM only method, the Ah-integral method and the measured value.
Figure 10B:
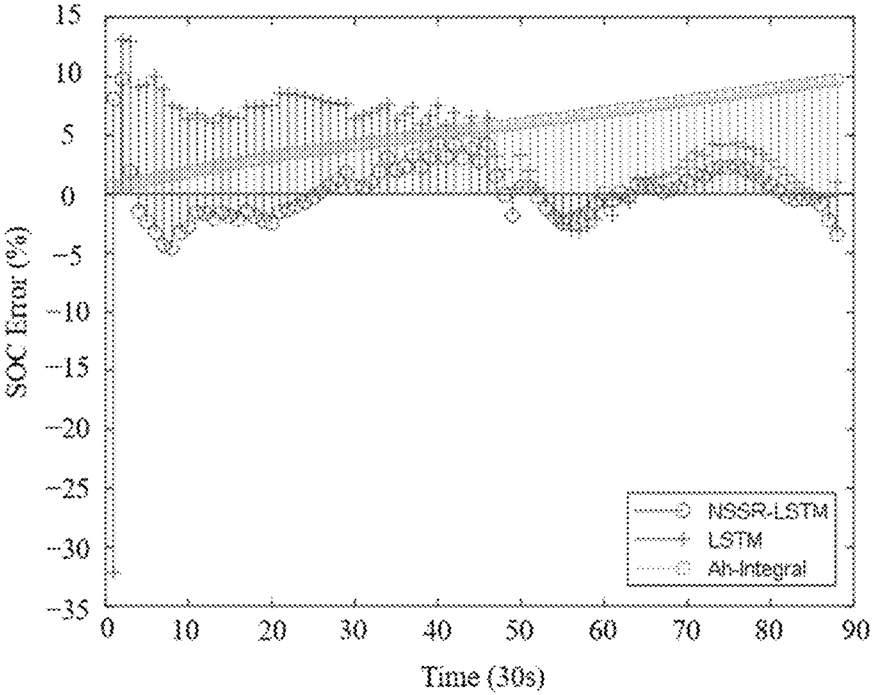
FIG. 10*b* is a graph showing SOC RMSE comparison of the 800th round between the joint estimation of NSSR-LSTM, the LSTM only method and the Ah-Integral method.

For the 800th cycle, the RMSE of the State of Health (SOH) estimation stands at 1.23%, as detailed in FIG. 9*a* and FIG. 9*b*. Throughout various points of this cycle, the SOH estimation maintains a stable accuracy, not exceeding 1.8%. These SOH estimations are subsequently utilized as critical input parameters for the State of Charge (SOC) estimation. Employing the NSSR-LSTM approach for joint estimation, the SOC RMSE is calculated to be 2.43% for the 800th cycle. When compared to other methods, the ampere-hour (Ah) integral method results in an SOC RMSE of 6.02%, while the LSTM-only method yields an SOC RMSE of 6.69%. The comparative results of these estimations are presented in FIG. 10*a* and FIG. 10*b*, showcasing the relative performance of the different methods.

The foregoing primarily investigates the combined estimation of State of Health (SOH) and State of Charge (SOC) using the NSSR-LSTM method under a specific condition of 25° C. However, in real-world scenarios, electric vehicle (EV) batteries often operate across a range of temperatures. Therefore, future studies could explore how varying temperature conditions affect EV battery packs. Additionally, the joint estimation techniques according to the present invention have been validated at a constant rate of charge/discharge of 1 C, which has been observed to enhance accuracy. Future research may expand to include other rates of charge/discharge, contingent on the availability of additional experimental data or results.

The present invention conducts a comprehensive review of various prevalent methods for estimating the State of Charge (SOC) and State of Health (SOH) of batteries, such as the Ampere-hour (Ah) Integral methods, Open Circuit Voltage (OCV)-SOC methods, various filter-based methods, and data-driven approaches. To overcome the shortcomings inherent in these traditional methods, the present invention has provided novel method, system and algorithm for the joint estimation of SOC and SOH, utilizing the Nonlinear State Space Reconstruction (NSSR)-Long Short-Term Memory (LSTM) neural network. The process begins with estimating the SOH using the NSSR-LSTM-based joint estimation methods, followed by using these SOH estimations to calculate the SOC.

The accuracy of the present NSSR-LSTM method was validated through experimental results obtained from a dedicated testbed. This validation utilized battery state data specifically from the 700th and 800th cycles in the life cycle test. The experimental findings indicate that the estimation errors for both SOH and SOC in the NSSR-LSTM-based joint estimation are confined within 1.3% and 2.5%, respectively. Notably, these joint estimation errors are smaller compared to those obtained using the traditional Ah-Integral and LSTM-only methods, as presented in the table below.

| Estimation Methods | 700th Round RMSE | 800th Round RMSE |
|---|---|---|
| The joint estimation based on NSSR-LSTM | 2.41% | 2.43% |
| The Ah-Integral methods | 4.57% | 6.02% |
| The LSTM only methods | 9.13% | 6.69% |

In accordance with an aspect of the present invention, a system has been devised for efficiently estimating the State of Charge (SOC) and State of Health (SOH) of a battery pack. This system has been meticulously crafted to address the growing demand for accurate and cost-effective battery management in electric vehicles (EVs) and other applications. The system typically includes several key modules designed to carry out the aforementioned processes with precision and effectiveness.

Data Acquisition Module

At the frontend of the system is a Data Acquisition Module. This critical component is responsible for collecting time-series data related to the operational parameters of the battery pack. These can include voltage, current, dQ/dV (charge/discharge rate), temperature, number of cycles, SOC, and SOH. These data are typically sourced from a Battery Management System (BMS) that continuously monitors and gathers information about the performance of the battery pack. This initial step is fundamental as it provides the raw material (raw data) for subsequent analysis.

Data Processing Module

Once the data are collected, they undergo processing in the Data Processing Module. This module serves the vital function of preparing the data for analysis. It incorporates a Nonlinear State Space Reconstruction (NSSR) algorithm, which is instrumental in reconstructing the phase state spaces required for estimating SOH and SOC. Additionally, the module handles data normalization, ensuring that the neural network models receive data in a standardized format that facilitates effective analysis.

Estimation Module

The Estimation Module is the core of the system and comprises the first and second Long Short-Term Memory (LSTM) neural network models. These models are meticulously designed and configured for the specific tasks of estimating SOH and SOC, respectively. They take the reconstructed phase state spaces as input and use their neural network architecture to generate precise estimates of these critical battery parameters. These estimations are essential for assessing the condition and charge status of the battery pack.

Training Module

To ensure the accuracy of the neural network models, a dedicated Training Module is provided. The primary function of this module is to train the first and second LSTM neural network models. During training, the models learn from the historical data, and adjust their internal parameters to improve their estimation capabilities. In particular, the second LSTM neural network model is specifically trained using the second reconstruct phase state space as input, taking into account a previously estimated SOH value, to predict an estimated SOC value. This iterative training process is crucial for achieving high accuracy in predicting SOH and SOC.

Validation Module

The Validation Module plays a pivotal role in confirming the effectiveness of the trained models. It employs a testing dataset separate from the training data and calculates the root mean square error (RMSE) between the estimated SOH and SOC values generated by the models and the actual measured values obtained from the testbed. The RMSE serves as a metric of accuracy, allowing for refinement of the LSTM neural network models based on their performance. This iterative validation process ensures that the estimations are reliable and consistent.

Importantly, this entire system can be seamlessly integrated into the computing environment of an EV or incorporated into the BMS and battery pack itself. This real-time integration enables continuous monitoring of the condition and charge status of the battery pack, ensuring its optimal performance and safety. This comprehensive system offers an efficient and cost-effective solution for estimating SOC and SOH in battery packs. It combines data collection, processing, neural network modeling, training, and validation into a cohesive framework. Its integration into the EV ecosystem allows for constant monitoring and accurate prediction of battery health and charge status, contributing to the longevity and reliability of electric vehicle batteries.

It should also be understood that although the specification is described in terms of embodiments, not every embodiment includes only a single technical solution. This description of the specification is merely for the sake of clarity. Those skilled in the art should regard the specification as a whole, and the technical solutions in the embodiments can also be combined appropriately to form other embodiments that can be understood by those skilled in the art. However, the protection scope of the present invention is defined by the appended claims rather than the foregoing description, and it is therefore intended that all changes that fall within the meaning and scope of equivalency of the claims are included in the present invention and any reference signs in the claims should not be regarded as limiting the involved claims.

What is claimed is:

1. A machine learning method of estimating State of Charge (SOC) and State of Health (SOH) of a battery pack, the method comprising:

collecting a plurality of first time-series data related to first operational parameters of a battery pack, wherein the first time-series data are collected from a battery management system (BMS) integrated with the battery pack, the BMS being configured to record the first operational parameters at predetermined intervals during charging and discharging cycles of the battery pack;

processing said collected first time-series data utilizing a Nonlinear State Space Reconstruction (NSSR) algorithm to reconstruct a first phase state space reconstruction;

training a first Long Short-Term memory (LSTM) neural network model using the first phase state space reconstruction for predicting SOH of said battery pack;

feeding said first time-series data to the first LSTM neural network to predict an estimated SOH value of the battery pack;

processing a plurality of second time-series data related to second operational parameters, utilizing said NSSR algorithm to reconstruct a second phase state space reconstruction;

training a second LSTM neural network model using the second phase state space reconstruction, taking into account said estimated SOH value, for predicting SOC of the battery pack; and feeding the second time-series data and said estimated SOH value of the battery pack to the second LSTM neural network to obtain an estimated SOC value.

2. The method according to claim 1, wherein accuracy of said estimated SOH value and said estimated SOC value is evaluated using a testing dataset, wherein the training of the first and second LSTM models continues until the accuracy reaches a predetermined threshold.

3. The method according to claim 1, wherein the training step of each of the first and second LSTM neural network models involves validating the trained model using a testing dataset and calculating the root mean square error (RMSE) between said estimated SOH and SOC values and testing SOH and SOC values, and refining the LSTM neural network models based on the RMSE.

4. The method according to claim 3, wherein the step of validating is focused on the middle and late periods of the cycle life of the battery pack.

5. The method according to claim 3, wherein the step of validating is performed using a constant 1 C rate of charge/discharge.

6. The method according to claim 1, wherein the NSSR includes determining a delay time and an embedding dimension for reconstructing the phase state spaces based on the collected time-series data.

7. The method according to claim 1, further comprising normalizing the collected first or second time-series data prior to processing with the NSSR.

8. The method according to claim 1, wherein the NSSR algorithm reduces the interference of instantaneous noises through a delayed phase state space.

9. The method according to claim 1, wherein the SOC is estimated continuously in real-time during operation of the battery pack and the SOH is estimated at the start or end of a charging cycle.

10. A system for estimating the State of Charge (SOC) and State of Health (SOH) of a battery pack using machine learning, comprising:

a data acquisition module configured to collect first time-series data related to first operational parameters and second time-series data related to second operational parameters of the battery pack;

a data processing module incorporating a Nonlinear State Space Reconstruction (NSSR) algorithm configured to reconstruct the first time-series data to a first reconstruct phase state space for SOH estimation and the second time-series data to a second reconstruct phase state space for SOC estimation;

an estimation module comprising a first Long Short-Term Memory (LSTM) neural network model configured for SOH estimation and a second LSTM neural network model configured for SOC estimation, based on the first and second reconstruct phase state space;

a training module for training the first and second LSTM neural network models, wherein:

the first LSTM neural network model is configured to be trained using the first reconstruct phase state space as input to predict an estimated SOH value;

the second LSTM neural network model is configured to be trained using the second reconstruct phase state space as input and taking into account said estimated SOH value, to predict an estimated SOC value;

wherein accuracy of said estimated SOH value and said estimated SOC value is evaluated using testing data, the training of the first and second LSTM models continues until the accuracy reaches a predetermined threshold.

11. The system according to claim 10 further comprising a validation module configured to validate each of the trained model using a testing dataset and calculate the root mean square error (RMSE) between said estimated SOH and SOC values and testing SOH and SOC values, and refine the LSTM neural network models based on the RMSE.

12. The system according to claim 11, wherein the validation is performed using a constant 1 C rate of charge/discharge.

13. The system according to claim 10, wherein the NSSR algorithm is configured to determine a delay time and an embedding dimension for reconstructing the phase state spaces based on the collected time-series data.

14. The system according to claim 10, wherein the data processing module is configured to perform normalization of the first or second time-series data prior to processing with the NSSR algorithm to mitigate the influence of outliers.

15. The system according to claim 10, wherein the NSSR algorithm is configured to reduce the interference of instantaneous noises through a delayed phase state space.

16. The system according to claim 10, wherein the system is configured to estimate the SOC continuously in real-time during operation of the battery pack and to estimate the SOH at the start or end of a charging cycle.

17. The system according to claim 10, wherein the training module is configured to perform adjustment of the LSTM neural network model parameters based on environmental factors including the temperature of working condition.

18. The system according to claim 10, wherein the training module is configured to input a state vector comprising a plurality of SOC and/or SOH values from previous time steps into the first and the second LSTM neural network models.

19. The method according to claim 1, wherein the first operational parameters include one or more of mean voltage, minimum temperature, ratio of capacity increment to voltage increment, and number of cycles.

20. The method according to claim 1, wherein the second operational parameters include one or more of mean voltage, minimum temperature, current, ratio of capacity increment to voltage increment, and SOH, wherein the SOH is the estimated SOH from the first LSTM neural network.

21. The system according to claim 10, wherein the first operational parameters include one or more of mean voltage, minimum temperature, ratio of capacity increment to voltage increment, and number of cycles.

22. The system according to claim 10, wherein the second operational parameters include one or more of mean voltage, minimum temperature, current, ratio of capacity increment to voltage increment, and SOH, wherein the SOH is the estimated SOH from the first LSTM neural network.

* * * * *